United States Patent [19]

Nagano

[11] Patent Number: 4,475,077
[45] Date of Patent: Oct. 2, 1984

[54] CURRENT CONTROL CIRCUIT

[75] Inventor: Katsumi Nagano, Shimonoseki, Japan

[73] Assignee: Tokyo Shibaura Denki Kabushiki Kaisha, Japan

[21] Appl. No.: 446,771

[22] Filed: Dec. 3, 1982

[30] Foreign Application Priority Data

Dec. 11, 1981 [JP] Japan ................................. 56-199764

[51] Int. Cl.³ .............................................. G05F 3/16
[52] U.S. Cl. .................................... 323/312; 323/315;
323/316; 330/257; 330/296; 330/288; 307/297
[58] Field of Search ......................... 323/312, 315–316;
330/257, 288, 296–297; 307/296 R, 297

[56] References Cited

U.S. PATENT DOCUMENTS

| 4,308,496 | 7/1980 | Nagano | 323/315 |
| 4,317,082 | 2/1982 | Gross | 330/288 |
| 4,352,057 | 9/1982 | Okada et al. | 323/315 |
| 4,370,608 | 1/1983 | Nagano et al. | 323/316 |

OTHER PUBLICATIONS van Kessel et al., "Integrated Linear Basic Circuits" Philips Technical Review, vol. 32, 1971, No. 1.

Primary Examiner—Peter S. Wong
Attorney, Agent, or Firm—Finnegan, Henderson, Farabow, Garrett & Dunner

[57] ABSTRACT

A current control circuit comprises a first transistor having its collector connected to an input current source, its emitter connected to a negative power source terminal and its base connected to a first reference current source, and a second transistor having its collector connected to an output current terminal, its emitter connected to the negative power source terminal and its base connected to a second reference current source. The bases of the first and second transistors are connected through respective resistors to the emitter of a third transistor, and the third transistor has its base connected to the collector of the first transistor and its collector connected to a positive power source terminal.

10 Claims, 7 Drawing Figures

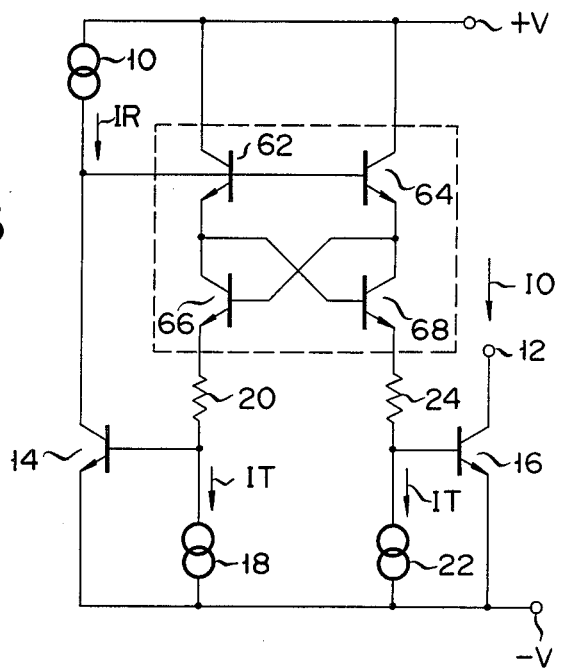
F I G. 3
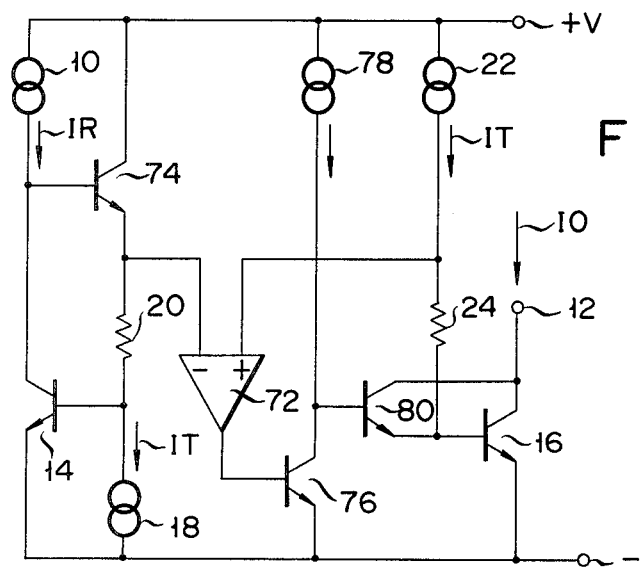
F I G. 4

4,475,077

CURRENT CONTROL CIRCUIT

BACKGROUND OF THE INVENTION

This invention relates to a current control circuit.

Several current control circuits are known which can arbitrarily set an amplification factor, i.e., a ratio between an input current and an output current. Such current control circuits are complicated in their arrangement and poor in the precision of the amplification factor.

SUMMARY OF THE INVENTION

It is accordingly the object of this invention to provide a current control circuit of a simple arrangement which can readily and accurately set the amplification factor to a proper value.

To attain this object, there is provided according to this invention a current control circuit comprising a first transistor having its collector connected to a current input terminal and its emitter connected to a first power source terminal, a second transistor having its collector connected to a current output terminal and its emitter connected to the first power source terminal, a first current source connected to the base of the first transistor to produce an electric current which is proportional to an absolute temperature, a second current source connected to the base of the second transistor to produce an electric current which is proportional to an absolute temperature, first and second resistors having their first terminals connected to the bases of the first and second transistors, and a control circuit connected to the second terminals of the first and second resistors and to the collector of the first transistor, causing the collector current of the first transistor to be equal to an input current and voltages on the second terminals of the first and second resistors to be equal to each other.

BRIEF DESCRIPTION OF THE DRAWINGS

FIG. 3 is a circuit diagram showing a current control circuit according to a second embodiment of this invention;

FIG. 4 is a circuit diagram showing a current control circuit according to a third embodiment of this invention;

DETAILED DESCRIPTION OF THE PREFERRED EMBODIMENT

A current control circuit according to a first embodiment of this invention will be explained below by referring to the accompanying drawings.

Figure 1:
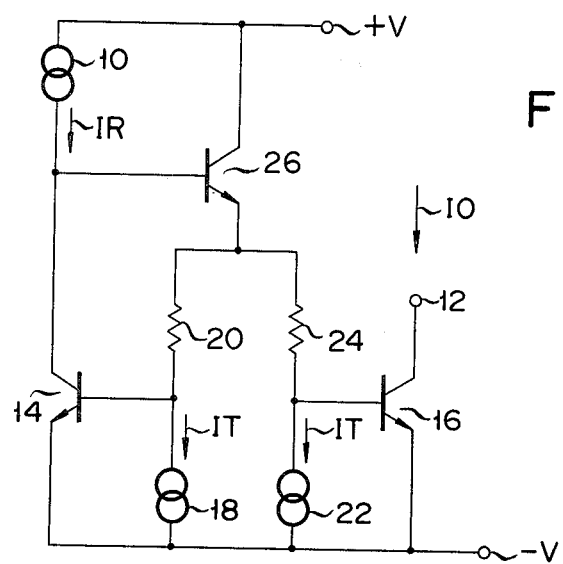
FIG. 1 is a circuit diagram showing a current control circuit according to a first embodiment of this invention.

FIG. 1 shows a current control circuit which produces at an output terminal 12 an electric current IO, obtained by amplifying an output current IR from a current source 10 (an input current source). The current source 10 is connected at one end to a positive power source terminal +V and at the other end to the collector of an NPN transistor 14 (transistors which will appear later are regarded as being of the NPN type unless otherwise specifically indicated). An output terminal 12 is connected to the collector of a transistor 16. The transistor 14 has its base connected to one terminal of a reference current source 18 and to one terminal of a resistor 20. The reference current source is intended to mean a current source adapted to produce an electric current IT which is proportional to an absolute temperature. The base of the transistor 16 is connected to one terminal of a reference current source 22 and to one terminal of a resistor 24. The emitters of the transistors 14 and 16 and the other terminals of the reference current sources 18 and 22 are connected to a negative power source terminal −V. The other terminals of the resistors 20 and 24 are connected to the emitter of a transistor 26. The transistor 26 has its base connected to the collector of the transistor 14. The collector of the transistor 26 is connected to the positive power source terminal +V.

Figure 2:
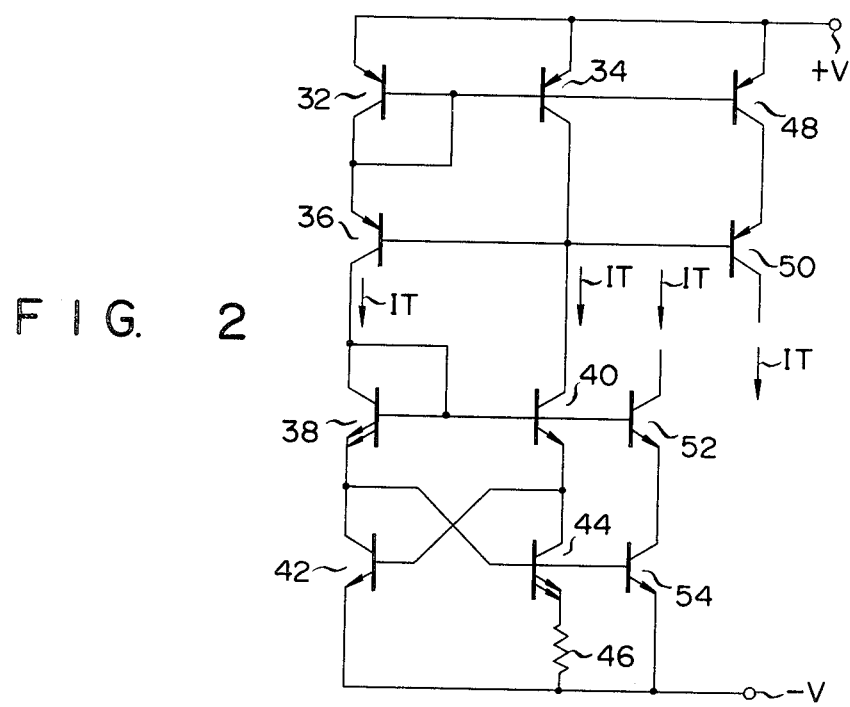
FIG. 2 is a circuit diagram showing a reference current source in FIG. 1.

FIG. 2 is a circuit diagram showing a detail of the reference current sources 18 and 22. The reference current source comprises a first current source comprised of PNP transistors 32, 34 and 36 and a second current source comprised of NPN transistors 38, 40, 42 and 44 and resistor 46. PNP transistors 48 and 50 for taking out an electric current IT are connected to the first current source and NPN transistors 52 and 54 for taking out an output current IT are connected to the second current source.

Before an explanation of the first embodiment, an explanation will be made of the operation of the reference current sources 18 and 22. It is known that the output current IT of the reference current source is given by:

$$IT = \frac{1}{R} \cdot \frac{kT}{q} \cdot \ln \frac{A38 \cdot A44}{A42 \cdot A40} \quad (1)$$

where,
k: Boltzmann's constant
q: electric charges
R: the value of resistor 46
A38, A40, A42, A44: the emitter areas of transistors 38, 40, 42 and 44, respectively.

Since in Equation (1) the emitter area of the respective transistor is constant, the ln term is constant. Now suppose the temperature coefficient of the resistor 46 to be constant. In this case, Equation (1) can be expressed as:

$$IT = \frac{KA \cdot VT}{R} \quad (2)$$

where $$KA = \ln \frac{A38 \cdot A44}{A42 \cdot A40}$$

$$VT = \frac{kT}{q} \propto T$$

That is, it follows that the output current IT of the reference current sources 18 and 22 is proportional to an absolute temperature T.

Reverting to FIG. 1, an emitter voltage of the transistor 26 can be found through two routes. That is, the voltage is expressed by a sum of the base-to-emitter voltage of the transistor 14 and a voltage drop across the resistor 20, or a sum of the base-to-emitter voltage of the transistor 16 and a voltage drop across the resistor 24. From this the following equation is found:

$$VBE(14) + IT \cdot R20 = VBE(16) + IT \cdot R24 \qquad \ldots (3)$$

The base-to-emitter voltages VBE(14) and VBE(16) of the transistors 14 and 16 are expressed as follows:

$$VBE(14) = VT \cdot \ln \frac{IR}{A14 \cdot IS} \qquad (4)$$

$$VBE(16) = VT \cdot \ln \frac{IO}{A16 \cdot IS} \qquad (5)$$

where
A14, A16: the emitter areas of the transistors 14, 16
IS : the reverse saturation current
Substituting Equations (2), (4) and (5) into Equation (3) and solving the equation for the output current IO gives:

$$VT \cdot \ln \frac{IR}{A14 \cdot IS} + \frac{R20}{R} \cdot KA \cdot VT = \qquad (6)$$

$$VT \cdot \ln \frac{IO}{A16 \cdot IS} + \frac{R24}{R} \cdot KA \cdot VT$$

$$\ln\left(\frac{A14}{A16} \cdot \frac{IO}{IR}\right) = \frac{R20 - R24}{R} \cdot KA$$

$$IO = \frac{A16}{A14} \cdot e^\alpha \cdot IR$$

where $$\alpha = \frac{R20 - R24}{R} \cdot KA$$

Since the respective emitter areas and value of the resistor are constant, $$\frac{A16}{A14} \cdot e^\alpha$$

becomes constant. From this it is found that the output current IO is proportional to the input current IR. If the above-mentioned emitter areas and value of the resistor are properly selected, the output current IO can be made greater or smaller than the input current IR. The amplification factor G of the current control circuit $$G = \frac{IO}{IR} = \frac{A16}{A14} \cdot e^\alpha$$

can be arbitrarily determined. Since the amplification factor G is not dependent upon the temperature, an accurate output current is obtained from this circuit.

The other embodiments of this invention will be explained below, in which same reference numerals are employed to designate like parts or elements throughout the specification. FIG. 3 is a circuit diagram showing a current control circuit according to a second embodiment of this invention. In this embodiment the transistor 26 is replaced by a circuit as enclosed by a broken line in the figure. This circuit comprises transistors 62 and 64 having their collectors connected to a positive power source terminal +V and their bases connected to the collector of a transistor 14, a transistor 66 having its collector-to-emitter path connected between the emitter of the transisor 62 and a resistor 20 and a transistor 68 having its collector-to-emitter path connected between the emitter of the transistor 64 and a resistor 24. The bases of the transistors 66 and 68 are connected to the collectors of the transistors 68 and 66, respectively.

In this embodiment, the following equation is obtained in connection with the base voltages of the transistors 62 and 64.

$$VBE(14) + R20 \cdot IT + VBE(66) + VBE(64) = $$
$$VBE(16) + R24 \cdot IT + VBE(68) + VBE(62) \qquad \ldots (7)$$

Here, the collector current of the transistor 62 is equal to that of the transistor 66 and the collector current of the transistor 64 is equal to that of the transistor 68. Thus, VBE(62)=VBE(66) and VBE(64)=VBE(68). When these relations are substituted into Equation (7), Equation (7) becomes equal to Equation (3) in the first embodiment. From this it is evident that the emitter voltages of the transistors 66 and 68 are equal to each other. For this reason, it is possible to obtain the same operation as in the first embodiment, i.e. it is possible to obtain an output current IO proportional to the input current IR.

A third embodiment of this invention will be explained below by referring to FIG. 4. In this embodiment an output current IO is controlled using a voltage comparator 72. Unlike the first and second embodiments, a reference current source 22 is connected to a positive power source terminal +V. A collector-to-emitter path of a transistor 74 is connected between the positive power source terminal +V and a resistor 20 and the base of the transistor 74 is connected to the collector of a transistor 14. The emitter of the transistor 74 is connected to an inverting input terminal (−) of the voltage comparator 72 and a junction of the reference current source 22 and resistor 24 is connected to a noninverting input terminal (+) of the voltage comparator 72. The output terminal of the voltage comparator 72 is connected to the base of a transistor 76. The emitter of the transistor 76 is connected to a negative power source terminal −V. The collector of the transistor 76 is connected to a current source 78 and to the base of a transistor 80 which is Darlington-connected to a transistor 16.

A voltage of the inverting input terminal (−) of the voltage comparator 72 is VBE(14)+R20·IT and a voltage on the noninverting input terminal (+) thereof is VBE(16)+R24·IT. When with an increase in the output current IO, the voltage VBE(16) is increased, $$VBE(16) + R24 \cdot IT > VBE(14) + R20 \cdot IT$$

Thus, an output signal of the voltage comparator 72 becomes a logical 1 level. For this reason, the transistor 76 is turned ON, decreasing the base current of the transistor 80 and the collector current IO of the transistor 16. As the sign of the above-mentioned inequality is reversed, an output signal of the voltage comparator 72 becomes a logical 0 level. As a result, the transistor 76 is turned OFF and the collector current IO of the transistor 16 is increased. In this way, both the input terminals of the voltage comparator 72 have equal potentials due to the voltage comparator 72, the transistors 76, 80 and the current source 78. Even in this embodiment, Equation (3) is established as in the first embodiment and the output current IO becomes proportional to the input current IR.

Figure 5:
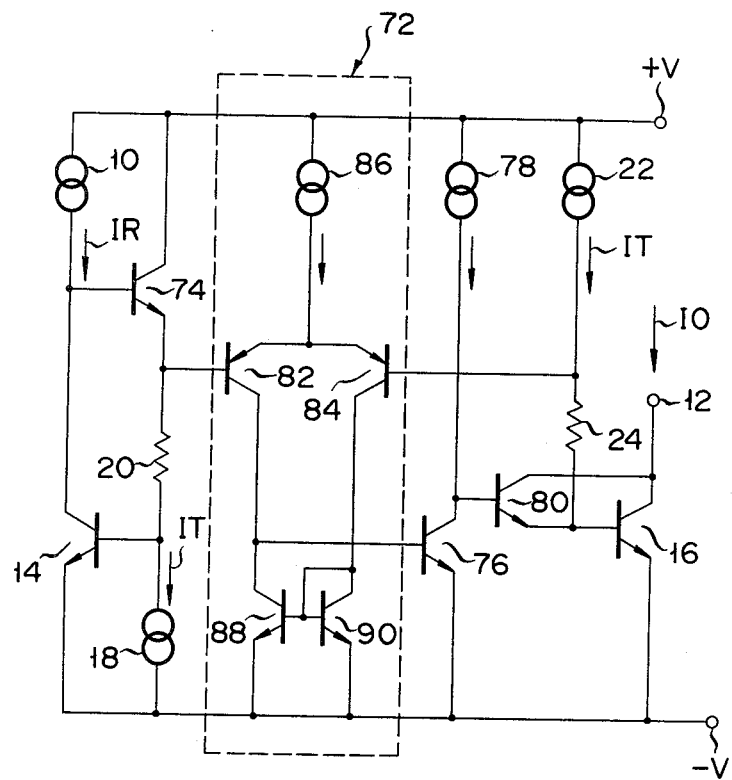
FIG. 5 is a view showing a detail of the embodiment of FIG. 4.

FIG. 5 is a circuit diagram showing a detail of the voltage comparator 72 in the third embodiment. A PNP transistor 82 has its base connected to the emitter of a transistor 74 and a PNP transistor 84 has its base connected to a junction of a reference current source 22 and resistor 24. The emitter of the transistor 82 is connected to the emitter of the transistor 84. A junction of the emitters of the transistors 82 and 84 is connected to a positive power source terminal +V through a current source 86. The collector of the transistor 82 is connected to a negative power source terminal −V through a collector-to-emitter path of a transistor 88. The collector of the transistor 84 is connected to the negative power source terminal −V through a collector-to-emitter path of a diode-connected transistor 90. The collector of the transistor 82 is connected to the base of a transistor 76.

Figure 6:
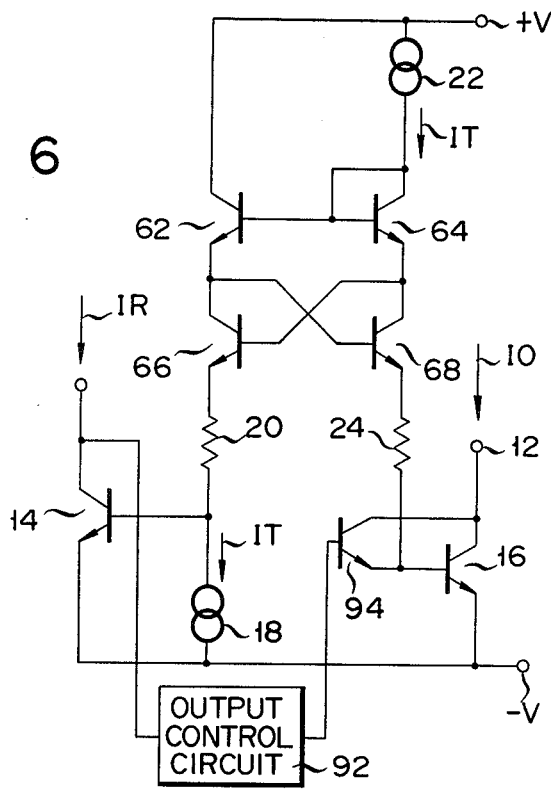
FIGS. 6 and 7 are circuit diagrams showing a fourth and fifth embodiments of this invention, respectively.

A fourth embodiment as shown in FIG. 6 acts as a protective circuit of a power transistor 16. This circuit is based on the second embodiment of FIG. 3 and obviates the necessity of providing the input current source 10 (FIG. 1). A reference current source 22 is connected to a positive power source terminal +V, not a negative power source terminal −V. An input current IR is supplied to the collector of a transistor 14 and an input current IR is supplied through an output control circuit 92 to the base of a transistor 94 which is Darlington-connected to the power transistor 16. In this embodiment, an input current IR proportional to the output current IO is derived from the collector of the transistor 14. When the input current IR is fed back to the transistor 94, the output current IO of the power transistor 16 is controlled, thus realizing a protective circuit of the power transistor 16.

Figure 7:
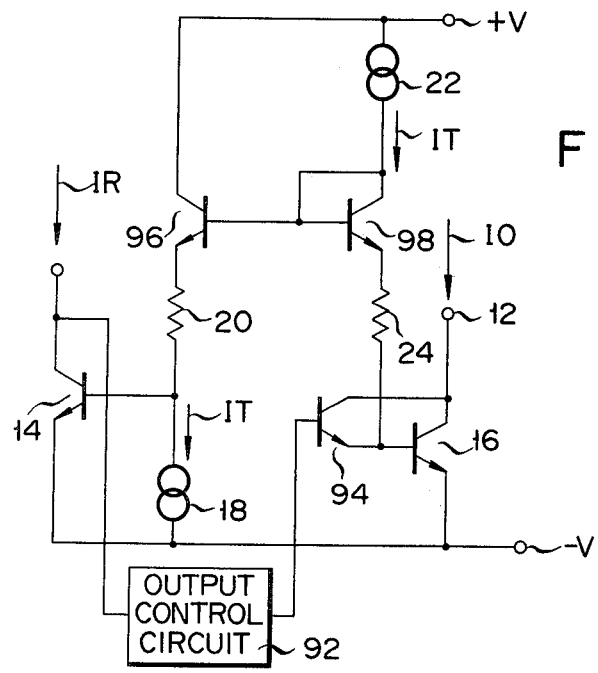

FIG. 7 shows a fifth embodiment i.e. a simplified version of the fourth embodiment. In this embodiment, the transistors 62, 66 of FIG. 6 are replaced by a transistor 96 and the transistors 64, 68 are replaced by a transistor 98.

According to this invention there is provided a current control circuit which has no temperature dependence and can obtain an arbitrary, high precision output current.

What is claimed is:
1. A current control circuit comprising:
   a first transistor having its collector connected to a current input terminal and its emitter connected to a first power source terminal;
   a second transistor having its collector connected to a current output terminal and its emitter connected to the first power source terminal;
   first and second resistors having their first terminals connected to the bases, respectively, of the first and second transistors;
   first and second current sources respectively connected to the first and second resistors to produce currents which are proportional to an absolute temperature; and
   control means connected to second terminals of the first and second resistors and to a collector of the first transistor for causing the collector current of the first transistor to be equal to an input current and for causing voltages on the second terminals of the first and second resistors to be equal to each other.

2. A current control circuit according to claim 1, in which said first and second current sources are respectively connected between the first power source terminal and the bases of the first and second transistors.

3. A current control circuit according to claim 2, in which said control means comprises a third transistor having its emitter connected to the second terminals of the first and second resistors, its base connected to the collector of the first transistor and its collector connected to a second power source terminal.

4. A current control circuit according to claim 2, in which said control means comprises a cross-coupled pair of third and fourth transistors having their emitters respectively connected to the second terminals of the first and second resistors and their bases connected to the collectors of the fourth and third transistors, and fifth and sixth transistors having their collector-to-emitter paths connected between the second power source terminal and the collectors of the third and fourth transistors respectively and their bases connected to the collector of the first transistor.

5. A current control circuit according to claim 1, in which said first current source is connected between the first terminal of the first resistor and the first power source terminal, said second current source is connected between the second terminal of the second resistor and the second power source terminal, and said control means has a voltage controller for controlling a base current of the second transistor according to voltages on the second terminals of the first and second resistors.

6. A current control circuit according to claim 5, in which said control means comprises a third transistor having its collector-to-emitter path connected between the second terminal of the first resistor and the second current source and its base connected to the collector of the first transistor, a voltage comparator having its inverting and noninverting input terminals connected to the second terminals of the first and second resistors, respectively, a fourth transistor having its base connected to an output terminal of the voltage comparator, its emitter connected to the first power source terminal and its collector connected to a third current source, and a fifth transistor which is Darlington-connected to the second transistor and has its base connected to the collector of the fourth transistor.

7. A current control circuit according to claim 6, in which said voltage comparator comprises sixth and seventh transistors having their bases connected to the second terminals of the first and second resistors and their emitters connected to each other, a fourth current source connected between the emitters of the sixth and seventh transistors and the second power source terminal, an eighth transistor having its collector-to-emitter path connected between the sixth transistor and the first power source terminal, and a ninth transistor having its collector connected to the collector of the seventh transistor, its emitter connected to the second power source terminal and its base connected to the collector of the seventh transistor and to the base of the eighth transistor.

8. A current control circuit according to claim 1, in which said control means comprises a third transistor having its emitter connected to the second terminal of the first resistor and its collector connected to a second power source terminal, a fourth transistor having its emitter connected to the second terminal of the second resistor and its base connected to the collector thereof and to the base of the third transistor, the first current source is connected between the first terminal of the first resistor and the first power source terminal, and the second current source is connected between the collector of the fourth transistor and the second power source terminal.

9. A current control circuit according to claim 8, in which said third and fourth transistors are connected respectively through the collector-to-emitter paths of the fifth and sixth transistors to the second terminals of the first and second resistors, and the bases of the fifth and sixth transistors are connected to the collectors of the sixth and fifth transistors.

10. A current control circuit according to claim 8 in which the collector current of the first transistor is supplied to the base of the seventh transistor which is Darlington-connected to the second transistor.

* * * * *